US012593639B2

(12) United States Patent
Namiki et al.

(10) Patent No.: US 12,593,639 B2
(45) Date of Patent: Mar. 31, 2026

(54) METHOD FOR PROCESSING SUBSTRATE, CHEMICAL SOLUTION, AND METHOD FOR PROVIDING CHEMICAL SOLUTION

(71) Applicant: TOKYO OHKA KOGYO CO., LTD., Kanagawa (JP)

(72) Inventors: Takumi Namiki, Kanagawa (JP); Kazumasa Wakiya, Kanagawa (JP); Yukihisa Wada, Kanagawa (JP)

(73) Assignee: TOKYO OHKA KOGYO CO., LTD., Kanagawa (JP)

( * ) Notice: Subject to any disclaimer, the term of this patent is extended or adjusted under 35 U.S.C. 154(b) by 0 days.

(21) Appl. No.: 18/695,607

(22) PCT Filed: Sep. 20, 2022

(86) PCT No.: PCT/JP2022/034953
§ 371 (c)(1),
(2) Date: Mar. 26, 2024

(87) PCT Pub. No.: WO2023/054055
PCT Pub. Date: Apr. 6, 2023

(65) Prior Publication Data
US 2024/0395538 A1     Nov. 28, 2024

Related U.S. Application Data

(60) Provisional application No. 63/250,239, filed on Sep. 30, 2021.

(51) Int. Cl.
*H01L 21/02* (2006.01)
*H10P 70/00* (2026.01)
(52) U.S. Cl.
CPC .............. *H10P 70/80* (2026.01); *H10P 70/15* (2026.01)

(58) Field of Classification Search
None
See application file for complete search history.

(56) References Cited

U.S. PATENT DOCUMENTS

| | | |
|---|---|---|
| 2012/0304485 A1 | 12/2012 | Hayashi et al. |
| 2013/0055584 A1 | 3/2013 | Sato et al. |
| 2018/0323076 A1 | 11/2018 | Yao et al. |

FOREIGN PATENT DOCUMENTS

| | | |
|---|---|---|
| EP | 0992852 A2 | 4/2000 |
| JP | 2000-223467 A | 8/2000 |

(Continued)

OTHER PUBLICATIONS

Google Patents translation of JP2004327894A (Year: 2025).*
Google Patents translation of JP 2007088257 (Year: 2025).*
Google Patents translation of JP2013179244A (Year: 2025).*

*Primary Examiner* — Eric W Golightly
(74) *Attorney, Agent, or Firm* — Rankin, Hill & Clark LLP

(57) ABSTRACT

A method for processing a substrate, for processing a surface of a substrate having projections/depressions formed on the surface, the method having: a rinsing step S101 of rinsing the surface of the substrate with a rinsing solution containing water; a chemical solution replacement step S102 of bringing a chemical solution into contact with the surface of the substrate that has been rinsed, to replace a liquid adhering to the surface of the substrate from the rinsing solution to the chemical solution; a state change step S103 of raising a temperature of the substrate wetted with the chemical solution to a temperature equal to or higher than the critical temperature of the chemical solution to allow the chemical solution to reach a supercritical state; and a removing step S104 of removing the chemical solution in the supercritical state from the surface of the substrate, in which the chemical solution contains an organic solvent (S1) (excluding, how- (Continued)

ever, organic solvents having a fluorine atom) having a higher specific gravity than water.

9 Claims, 2 Drawing Sheets

(56)                    References Cited

FOREIGN PATENT DOCUMENTS

| | | | |
|---|---|---|---|
| JP | 2003-206497 | A | 7/2003 |
| JP | 2003-347261 | A | 12/2003 |
| JP | 2004327894 | A  * | 11/2004 |
| JP | 2006-040969 | A | 2/2006 |
| JP | 2007-088257 | A | 4/2007 |
| JP | 2008-130685 | A | 6/2008 |
| JP | 2013-055230 | A | 3/2013 |
| JP | 2013-179244 | A | 9/2013 |
| JP | 2017-092285 | A | 5/2017 |
| JP | 2017-195312 | A | 10/2017 |
| TW | 201107464 | A | 3/2011 |
| WO | 2010091045 | A2 | 8/2010 |

* cited by examiner

METHOD FOR PROCESSING SUBSTRATE, CHEMICAL SOLUTION, AND METHOD FOR PROVIDING CHEMICAL SOLUTION

Priority is claimed on U.S. 63/250,239, filed on Sep. 30, 2021, the content of which is incorporated herein by reference.

TECHNICAL FIELD

The present invention relates to a method for processing a substrate, a chemical solution, and a method for providing the chemical solution.

BACKGROUND ART

In recent years, in the manufacture of semiconductor elements and liquid crystal display elements, patterns of semiconductor substrates have been made more finely, due to the advanced lithography technology. As patterns of semiconductor substrates become finer, the aspect ratio of the patterns of the semiconductor substrates tends to increase.

Meanwhile, in the manufacturing process of semiconductors, the manufacturing yield decreases due to mixing of particles and the like. Therefore, the substrate is washed with a rinsing solution in order to remove particles and the like adhering to the substrate. After the substrate having a pattern formed thereon is washed with the rinsing solution, the rinsing solution is removed by drying the substrate. In this case, the pattern on the substrate surface may collapse due to the capillary force of the rinsing solution remaining in the pattern.

As a method for solving the pattern collapse problem, a supercritical drying method using a supercritical fluid having almost zero surface tension has been proposed. According to the supercritical drying method, since no gas-liquid interface is formed, the surface of the substrate can be dried without causing the capillary force to act.

For example, Patent Document 1 proposes a semiconductor substrate processing method including washing a surface of a semiconductor substrate with an aqueous washing solution, and drying the aqueous washing solution adhering to the substrate surface by replacing to a supercritical fluid, in which as the fluid, a solvent of which a content of each element of Fe, Ni, Cr, Al, Zn, Cu, Mg, Li, K, Na, and Ca is 500 mass ppb or less, and that includes fluorine-containing alcohol having 2 to 6 carbon atoms is used.

CITATION LIST

Patent Document

[Patent Document 1]
Japanese Unexamined Patent Application, First Publication No. 2017-92285

SUMMARY OF INVENTION

Technical Problem

In the semiconductor substrate processing method described in Patent Document 1, fluorine-containing alcohol having 2 to 6 carbon atoms is used as a solvent. Since the fluorine-containing alcohol does not have high general versatility as a solvent, is not readily available, and has a high global warming potential, challenges remain for application to mass production.

Further, isopropyl alcohol (IPA) is also generally used as a supercritical fluid. However, since IPA is likely to absorb moisture in the atmosphere and is likely to involve external impurities, there is a concern that this may be the starting point of pattern collapse.

The present invention has been made in view of the above circumstances, and an object of the present invention is to provide a method for processing a substrate with a good pattern collapse suppression effect in the processing of a substrate surface having projections/depressions formed thereon, a chemical solution that is used in the method for processing a substrate, and a method for providing the chemical solution.

Solution to Problem

In order to achieve the above-described object, the present invention employs the following configurations.

That is, a first aspect of the present invention provides a method for processing a substrate, for processing a surface of a substrate having projections/depressions formed on the surface, having: a rinsing step of rinsing the surface of the substrate with a rinsing solution containing water; a chemical solution replacement step of bringing a chemical solution into contact with the surface of the substrate that has been rinsed, to replace a liquid adhering to the surface of the substrate from the rinsing solution to the chemical solution; a state change step of raising the temperature of the substrate wetted with the chemical solution to a temperature equal to or higher than the critical temperature of the chemical solution to allow the chemical solution to reach a supercritical state; and a removing step of removing the chemical solution in the supercritical state from the surface of the substrate, in which the chemical solution contains an organic solvent (S1) (excluding, however, organic solvents having a fluorine atom) having a higher specific gravity than water.

A second aspect of the present invention provides a chemical solution that is used in a method for processing a substrate having a rinsing step of rinsing a surface of a substrate having projections/depressions formed on the surface with a rinsing solution containing water, a chemical solution replacement step of bringing a chemical solution into contact with the surface of the substrate that has been rinsed, to replace a liquid adhering to the surface of the substrate from the rinsing solution to the chemical solution, a state change step of raising the temperature of the substrate wetted with the chemical solution to a temperature equal to or higher than the critical temperature of the chemical solution to allow the chemical solution to reach a supercritical state, and a removing step of removing the chemical solution in the supercritical state from the surface of the substrate, the chemical solution having: an organic solvent (S1) (excluding, however, organic solvents having a fluorine atom) having a higher specific gravity than water.

A third aspect of the present invention provides a method for providing a chemical solution, for providing the chemical solution to a process line carrying out the method for processing a substrate according to the first aspect of the present invention.

Advantageous Effects of Invention

According to the present invention, it is possible to provide a method for processing a substrate with a good pattern collapse suppression effect in the processing of a substrate surface having projections/depressions formed thereon, a chemical solution that is used in the method for processing a substrate, and a method for providing the chemical solution.

Figure 1:
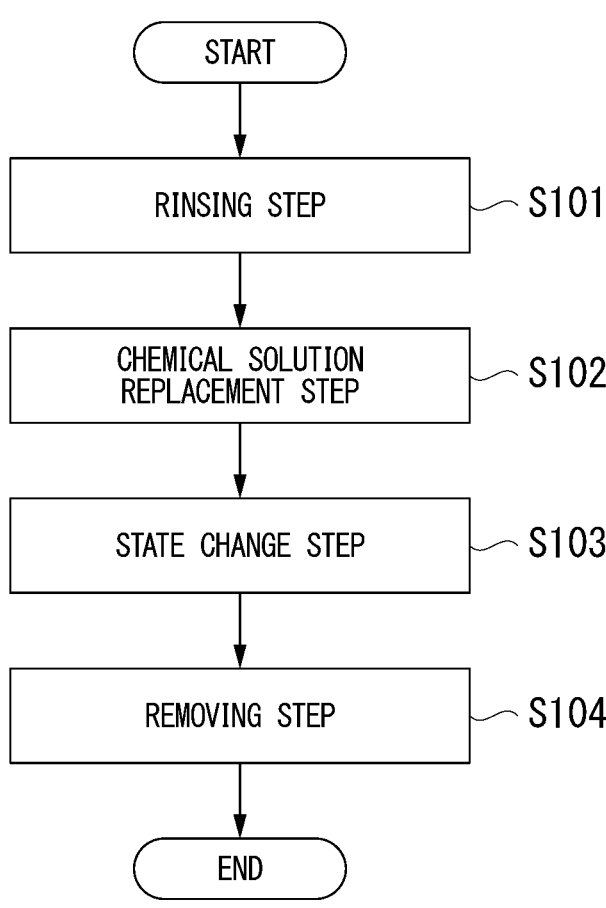
FIG. 1 is a flowchart of a method for processing a substrate according to a first embodiment.

DESCRIPTION OF EMBODIMENTS (Method for Processing Substrate)

A first aspect of the present invention provides a method for processing a substrate, for processing a surface of a substrate having projections/depressions formed on the surface, having: a rinsing step of rinsing the surface of the substrate with a rinsing solution containing water; a chemical solution replacement step of bringing a chemical solution into contact with the surface of the substrate that has been rinsed, to replace the liquid adhering to the surface of the substrate from the rinsing solution to the chemical solution; a state change step of raising the temperature of the substrate wetted with the chemical solution to a temperature equal to or higher than the critical temperature of the chemical solution to allow the chemical solution to reach a supercritical state; and a removing step of removing the chemical solution in the supercritical state from the surface of the substrate, in which the chemical solution contains an organic solvent (S1) (excluding, however, organic solvents having a fluorine atom) having a higher specific gravity than water.

The substrate is not particularly limited and a conventionally known substrate can be used. Examples thereof include a silicon (Si) substrate, a silicon nitride (SiN) substrate, a silicon oxide film (Ox) substrate, a silicon carbide (SiC) substrate, a tungsten (W) substrate, a tungsten carbide (WC) substrate, a cobalt (Co) substrate, a titanium nitride (TiN) substrate, a tantalum nitride (TaN) substrate, a germanium (Ge) substrate, a silicon germanium (SiGe) substrate, an aluminum (Al) substrate, a nickel (Ni) substrate, a titanium (Ti) substrate, a ruthenium (Ru) substrate, and a copper (Cu) substrate.

Using a silicon (Si) substrate as an example, a substrate having a surface on which a silicon oxide film such as a natural oxide film, a thermal oxide film, and a vapor-phase synthetic film (such as a CVD film) is formed may be used, and a substrate having a pattern that is formed on the silicon oxide film may be used.

Examples of the "surface" include a surface of an inorganic pattern provided on a substrate and a surface of an unpatterned inorganic layer in addition to the surface of the substrate itself.

Examples of the inorganic pattern provided on the substrate include an inorganic pattern formed by producing an etching mask on a surface of an inorganic layer present on the substrate with a photoresist method and then performing an etching treatment. Examples of the inorganic layer include, in addition to the substrate itself, a layer made of an oxide of an element constituting the substrate and a layer made of an inorganic substance such as a silicon nitride, a titanium nitride, and tungsten formed on the surface of the substrate. Such an inorganic layer is not particularly limited. Examples thereof include an inorganic layer formed in the course of manufacturing a semiconductor device.

The shape of the pattern is not particularly limited and can be, for example, a pattern shape generally formed in a semiconductor manufacturing process. The pattern shape may be a line pattern, a hole pattern, or a pattern including a plurality of pillars. The pattern shape is preferably a pattern including a plurality of pillars. The shape of the pillar is not particularly limited. Examples thereof include a cylindrical shape and a polygonal prism shape (such as a square prism shape).

First Embodiment

FIG. 1 shows a flowchart of a method for processing a substrate according to a first embodiment.

The method for processing a substrate according to the present embodiment has: a rinsing step S101 of rinsing a surface of the substrate with a rinsing solution containing water; a chemical solution replacement step S102 of bringing a chemical solution into contact with the surface of the substrate that has been rinsed, to replace the liquid adhering to the surface of the substrate from the rinsing solution to the chemical solution; a state change step S103 of raising the temperature of the substrate wetted with the chemical solution to a temperature equal to or higher than the critical temperature of the chemical solution to allow the chemical solution to reach a supercritical state; and a removing step S104 of removing the chemical solution in the supercritical state from the surface of the substrate.

[Rinsing Step S101]

The rinsing step S101 is a step of rinsing a surface of a substrate with a rinsing solution containing water.

The rinsing method is not particularly limited, and a method that is generally used for substrate washing in a semiconductor manufacturing process can be employed. Examples of the method include a spin coating method, an immersion method (dipping method), a spray method, and a liquid filling method (paddle method) which will be described later.

The spin coating method is a method for rotating a substrate using a spin coater or the like and applying or spraying a rinsing solution onto the rotated substrate.

The immersion method (dipping method) is a method for immersing a substrate in a rinsing solution.

The spray method is a method for transporting a substrate in a predetermined direction and spraying a rinsing solution to the space.

The liquid filling method (paddle method) is a method for putting a rinsing solution on a substrate by surface tension and leaving it for a certain period of time.

Among these above, the spin coating method is preferable in the rinsing step S101. The rotational speed of the spinning is, for example, 100 rpm or greater and 5,000 rpm or less.

Rinsing Solution

The rinsing solution in the rinsing step S101 contains water. As the water, pure water, deionized water, ion exchange water, or the like can be used.

In the present embodiment, the rinsing solution may contain an organic solvent in addition to water.

Examples of the organic solvent include hydrocarbons, esters, ethers, ketones, halogen-containing solvents, sulfoxide-based solvents, alcohols, polyhydric alcohol derivatives, and nitrogen-containing compound solvents.

The rinsing solution may further contain a known additive and the like. Examples of the known additive include a fluorine-based surfactant and a silicone-based surfactant.

Specific examples of the fluorine-based surfactant include commercially available fluorine-based surfactants such as BM-1000, BM-1100 (all manufactured by BM Chemie), MEGAFAC F142D, MEGAFAC F172, MEGAFAC F173, and MEGAFAC F183 (all manufactured by DIC Corporation), FLUORAD FC-135, FLUORAD FC-170C, FLUORAD FC-430, and FLUORAD FC-431 (all manufactured by 3M), SURFLON S-112, SURFLON S-113, SURFLON S-131, SURFLON S-141, and SURFLON S-145 (all manufactured by AGC Inc.), and SH-28PA, SH-190, SH-193, SZ-6032, and SF-8428 (all manufactured by Dow Corning Toray Co., Ltd.).

As the silicone-based surfactant, specifically, unmodified silicone-based surfactants, polyether-modified silicone-based surfactants, polyester-modified silicone-based surfactants, alkyl-modified silicone-based surfactants, aralkyl-modified silicone-based surfactants, and reactive silicone-based surfactants, and the like can be preferably used.

As the silicone-based surfactant, commercially available silicone-based surfactants can be used. Specific examples of the commercially available silicone-based surfactants include Paintad M (manufactured by Dow Corning Toray Co., Ltd.), Topica K1000, Topica K2000, and Topica K5000 (all manufactured by Takachiho Industry Co., Ltd.), XL-121 (polyether-modified silicone-based surfactant, manufactured by Clariant Co.), and BYK-310 (polyester-modified silicone-based surfactant, manufactured by BYK).

[Chemical Solution Replacement Step S102]

The chemical solution replacement step S102 is a step of bringing a chemical solution into contact with the surface of the substrate that has been rinsed through the above-described rinsing step S101, to replace the liquid adhering to the surface of the substrate from the rinsing solution to the chemical solution.

In the method for processing a substrate according to the present embodiment, at least the chemical solution replacement step S102 and the state change step S103 to be described later are performed in the same chamber.

The chamber is, for example, a high-pressure container made of stainless steel and ensuring predetermined pressure resistance.

The method for bringing the chemical solution into contact with the surface of the substrate is not particularly limited, and examples thereof include the spin coating method, the immersion method (dipping method), the spray method, and the liquid filling method (paddle method) described above.

<Chemical Solution>

The chemical solution in the chemical solution replacement step S102 contains the organic solvent (S1) having a higher specific gravity than water. However, the organic solvent (S1) excludes organic solvents having a fluorine atom.

In the present embodiment, preferably, the chemical solution does not contain an organic solvent having a fluorine atom from the viewpoint of cost reduction and environmental load reduction.

<<Organic Solvent (S1)>>

In the present embodiment, the organic solvent (S1) is not particularly limited as long as it is an organic solvent having no fluorine atom and having a higher specific gravity than water. The organic solvent (S1) is preferably a polar solvent such as a carbonate-based solvent or a lactone-based solvent.

In the present specification, the "specific gravity" is a value calculated using water at 4° C. as a standard substance.

In the present embodiment, specific preferable examples of the organic solvent (S1) include propylene carbonate (specific gravity: 1.2047, solubility: 29.3), dimethyl carbonate (specific gravity: 1.0636, solubility: 8.5), ethylene carbonate (specific gravity: 1.3214, solubility: 29.3), diethyl carbonate (specific gravity: 1.069, solubility: 1.8), butylene carbonate (specific gravity: 1.107, solubility: 13.5), furfuryl alcohol (specific gravity: 1.1296, solubility: 7.7), tetrahydrofurfuryl alcohol (specific gravity: 1.0544, solubility: 16.9), dihydrolevoglucosenone (silene, specific gravity: 1.261, solubility: 3.2), γ-butyrolactone (specific gravity: 1.1284, solubility: 7.0), γ-valerolactone (specific gravity: 1.05474, solubility: 3.5), and 8-valerolactone (specific gravity: 1.113, solubility: 4.3).

The solubility of each organic solvent (S1) is solubility (g/100 mL) indicating how many grams of water dissolves in 100 mL of each organic solvent (S1) at 25° C.

In the present embodiment, the specific gravity of the organic solvent (S1) is higher than 1.0, preferably 1.05 or higher, and more preferably 1.1 or higher.

One organic solvent (S1) may be used alone, or two or more thereof may be used in combination.

The ratio of the organic solvent (S1) in the chemical solution is preferably 50% by mass or greater, more preferably 75% by mass or greater, and may be 100% by mass with respect to the total mass of the chemical solution.

<<Another Organic Solvent (S2)>>

In the present embodiment, the chemical solution may contain an organic solvent (S2) other than the above-described organic solvent (S1).

Examples of another organic solvent (S2) include protic polar solvents such as glycol-based solvents, glycol ether-based solvents, and alcohol-based solvents; aprotic polar solvents such as ester-based solvents, amide-based solvents, sulfoxide-based solvents, sulfone-based solvents, and nitrile-based solvents; and hydrocarbon-based solvents.

One organic solvent (S2) may be used alone, or two or more thereof may be used in combination.

In the present embodiment, the chemical solution may be composed of only the organic solvent (S1) or may be a mixed solvent of the organic solvent (S1) and the organic solvent (S2). However, even in a case of the mixed solvent, the specific gravity is preferably higher than 1.0, more preferably 1.05 or higher, and even more preferably 1.1 or higher. That is, in the present embodiment, the specific gravity of the chemical solution as a whole is preferably higher than 1.0, more preferably 1.05 or higher, and even more preferably 1.1 or higher.

The chemical solution in the chemical solution replacement step S102 preferably has a property that 0.5 to 40 g of water dissolves in 100 mL of the chemical solution at 25° C., more preferably has a property that 1 to 30 g of water dissolves in 100 mL of the chemical solution at 25° C., and even more preferably has a property that 2 to 20 g of water dissolves in 100 mL of the chemical solution at 25° C.

In a case where the chemical solution has the above-described dissolution characteristics, the replaceability from the rinsing solution to the chemical solution and the pattern collapse suppression effect are improved with good balance.

For the dissolution characteristics of the chemical solution described above, an organic solvent (S1) satisfying the above-described range may be selected, or an organic solvent (S1) and an organic solvent (S2) may be mixed and adjusted to satisfy the above-described range.

<<Other Components>>

The chemical solution can contain components other than the organic solvent (S1) and the organic solvent (S2) as long as the effects of the present invention are not impaired. Examples of other components include metal chelating agents (aminocarboxylic acid-based chelating agents, phosphonic acid-based chelating agents, acetylene alcohol, and the like), pH adjusters, surfactants, and known organic solvents that do not correspond to the above-described solvents.

[State Change Step S103]

The state change step S103 is a step of raising the temperature of the substrate wetted with the chemical solution through the above-described chemical solution replacement step S102 to a temperature equal to or higher than the critical temperature of the chemical solution to allow the chemical solution to reach a supercritical state. The chemical solution can reach a supercritical state by subjecting it to a temperature and a pressure equal to or higher than critical points. Here, the supercritical state is a state of a substance under a temperature and a pressure equal to or higher than critical points, and the chemical solution in the supercritical state has both gas diffusivity and a liquid dissolving property (high density).

In the state change step S103, the chemical solution is heated and pressurized to critical points or higher.

[Removing Step S104]

The removing step S104 is a step of removing, from the surface of the substrate, the chemical solution that has reached the supercritical state through the above-described state change step S103.

In the method for processing a substrate according to the present embodiment, since the chemical solution is allowed to reach the supercritical state and then removed, drying can be performed in a state in which no interface is formed between the liquid and the gas and no surface tension acts on the pattern.

Specific examples of the removing step S104 include an operation of removing the chemical solution from the surface of the substrate by tilting the substrate and flowing the chemical solution in the supercritical state, and an operation of vaporizing the chemical solution in the supercritical state by decreasing the pressure.

In the present embodiment, as the removing step S104, an operation of removing the chemical solution from the surface of the substrate by tilting the substrate and flowing the chemical solution in the supercritical state is preferably included.

Optional Steps

The method for processing a substrate according to the present embodiment may have optional steps other than the rinsing step S101, the chemical solution replacement step S102, the state change step S103, and the removing step S104 described above. Examples of the optional steps include a washing step.

<Washing Step>

The washing step is a step of washing the surface of the substrate in advance before the above-described rinsing step S101.

The washing method is not particularly limited, and examples of the substrate washing method include a known RCA washing method. In the RCA washing method, the substrate is first immersed in an SC-1 solution made of hydrogen peroxide and ammonium hydroxide to remove fine particles and organic matter from the substrate.

Next, the substrate is immersed in a hydrofluoric acid aqueous solution so that a natural oxide film on the surface of the substrate is removed. Thereafter, the substrate is immersed in an acidic SC-2 solution made of hydrogen peroxide and dilute hydrochloric acid to remove alkali ions and metal impurities that are insoluble in the SC-1 solution.

In the method for processing a substrate according to the present embodiment described above, the chemical solution containing the organic solvent (S1) having a higher specific gravity than water is used and allowed to reach a supercritical state to process the substrate. Accordingly, in the replacement from a rinsing solution containing water to the chemical solution, the chemical solution enters a lower portion of the rinsing solution, and thus the rinsing solution on the substrate can be effectively removed. Therefore, in the method for processing a substrate according to the present embodiment, it is possible to remove even a very small amount of the rinsing solution remaining on the substrate, and thus the pattern collapse suppression effect is improved.

In addition, in a case where, as the chemical solution, a chemical solution having an appropriately low dissolving property with respect to water is selected, it does not easily absorb moisture in the atmosphere and does not easily involve external impurities, and thus the pattern collapse suppression effect is further improved.

In addition, in a case where the chemical solution does not contain an organic solvent having a fluorine atom, it is possible to further reduce the cost and the environmental load.

Second Embodiment

Figure 2:
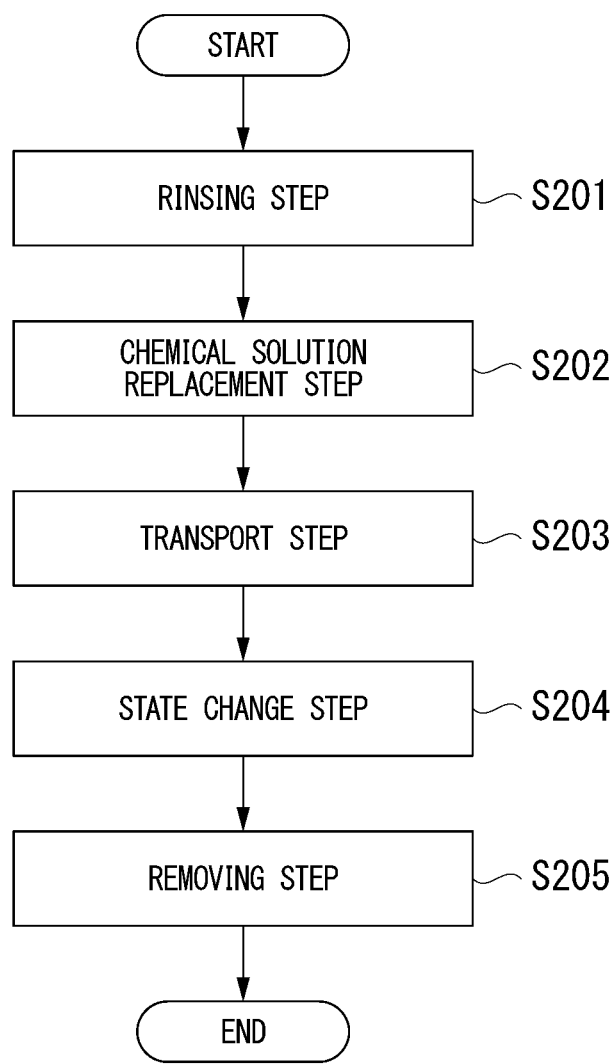
FIG. 2 is a flowchart of a method for processing a substrate according to a second embodiment.

FIG. 2 shows a flowchart of a method for processing a substrate according to a second embodiment.

The method for processing a substrate according to the present embodiment is a method for processing a substrate having: a rinsing step S201 of rinsing a surface of the substrate with a rinsing solution containing water; a chemical solution replacement step S202 of bringing a chemical solution into contact with the surface of the substrate that has been rinsed in a first chamber, to replace the liquid adhering to the surface of the substrate from the rinsing solution to the chemical solution; a transport step of transporting the substrate from the first chamber where the chemical solution replacement step S202 has been performed to a second chamber; a state change step S204 of raising the temperature of the substrate wetted with the chemical solution and transported into the second chamber to a temperature equal to or higher than the critical temperature of the chemical solution to allow the chemical solution to reach a supercritical state; and a removing step S205 of removing the chemical solution in the supercritical state from the surface of the substrate, in which the chemical solution contains the above-described organic solvent (S1).

[Rinsing Step S201]

In the present embodiment, the rinsing step S201 is the same step as the above-described rinsing step S101.

[Chemical Solution Replacement Step S202]

In the present embodiment, the chemical solution replacement step S202 is the same step as the above-described rinsing step S201. However, in the present embodiment, at least the chemical solution replacement step S202 and the state change step S204 are performed in different chambers.

The first chamber where the chemical solution replacement step S202 is performed is not particularly limited, and examples thereof include a container made of stainless steel.

[Transport Step S203]

The transport step S203 is a step of transporting the substrate from the first chamber where the chemical solution replacement step S202 is performed to the second chamber where the state change step S204 is performed.

Specific examples of the method for transporting the substrate include a method for transporting a substrate by a transport roller and a method for floating and transporting a substrate by air.

In the present embodiment using the chemical solution, even in the method for processing a substrate having the transport step S203 in which the moisture in the atmosphere is likely to be absorbed, a very small amount of the rinsing solution can be removed in the subsequent removing step S205. Therefore, a good pattern collapse suppression effect is provided.

[State Change Step S204]

The state change step S204 is the same step as the above-described state change step S104.

Examples of the first chamber where the state change step S204 is performed include a high-pressure container made of stainless steel and ensuring predetermined pressure resistance.

[Removing Step S205]

The removing step S205 is the same step as the above-described removing step S105.

The method for processing a substrate according to the second embodiment may also have optional steps such as the above-described washing step.

Since the method for processing a substrate according to the present embodiment described above uses the chemical solution containing the above-described organic solvent (S1), the rinsing solution can be effectively removed even in the method for processing a substrate having the transport step S203, and thus a good pattern collapse suppression effect is provided.

In addition, in a case where, as the chemical solution, a chemical solution having an appropriately low dissolving property with respect to water is selected, it does not easily absorb moisture in the atmosphere and does not easily involve external impurities in the transport step S203, and thus the pattern collapse suppression effect is further improved.

(Chemical Solution)

A second aspect of the present invention provides a chemical solution that is used in a method for processing a substrate having a rinsing step of rinsing a surface of a substrate having projections/depressions formed on the surface with a rinsing solution containing water, a chemical solution replacement step of bringing a chemical solution into contact with the surface of the substrate that has been rinsed, to replace a liquid adhering to the surface of the substrate from the rinsing solution to the chemical solution, a state change step of raising the temperature of the substrate wetted with the chemical solution to a temperature equal to or higher than the critical temperature of the chemical solution to allow the chemical solution to reach a supercritical state, and a removing step of removing the chemical solution in the supercritical state from the surface of the substrate, the chemical solution having: an organic solvent (S1) (excluding, however, organic solvents having a fluorine atom) having a higher specific gravity than water.

Examples of the chemical solution according to the present embodiment are the same as those described in the method for processing a substrate according to the first aspect of the present invention described above.

The chemical solution according to the present embodiment is useful for use in the supercritical drying method such as the method for processing a substrate according to the first aspect of the present invention described above.

Since the chemical solution according to the present embodiment contains the above-described organic solvent (S1), the chemical solution enters a lower portion of the rinsing solution in the replacement from the rinsing solution containing water to the chemical solution, and thus the rinsing solution on the substrate can be effectively removed. Therefore, with the chemical solution according to the present embodiment, it is possible to remove even a very small amount of the rinsing solution remaining on the substrate, and thus the pattern collapse suppression effect can be improved.

In addition, in a case where the chemical solution has an appropriately low dissolving property with respect to water, it does not easily absorb moisture in the atmosphere and does not easily involve external impurities, and thus the pattern collapse suppression effect can be further improved.

In addition, in a case where the chemical solution does not contain an organic solvent having a fluorine atom, the cost and the environmental load are further reduced.

(Method for Providing Chemical Solution)

A third aspect of the present invention provides a method for providing a chemical solution, for providing the chemical solution to a process line carrying out the method for processing a substrate according to the first aspect of the present invention.

Here, the chemical solution may be prepared by being appropriately selected from the materials (the organic solvent (S1) and the like) described above, and the preparation timing of the chemical solution may be determined depending on the size and the operating speed of the process line.

Further, the business entity that executes the method for processing a substrate and the business entity that executes the present providing method are not necessarily the same as each other.

For example, in the method for providing a chemical solution according to the present embodiment is a method for providing a chemical solution, to a process line in which the business entity that executes the method for processing a substrate described above executes the method for processing a substrate, another business entity provides the chemical solution.

As described above, according to the present invention, it is possible to provide a method for processing a substrate with a good pattern collapse suppression effect in the processing of a substrate surface having projections/depressions formed thereon.

EXAMPLES

Hereinafter, the present invention will be described in more detail based on reference examples, but is not limited to these examples.

The following test was performed to confirm an effect of replacing the rinsing solution adhering to a surface of a substrate with a chemical solution.

Test pieces, each composed of a silicon wafer, were prepared and immersed in pure water at room temperature for 30 seconds. Thereafter, each test piece pulled up from the pure water was immersed in a chemical solution shown in Table 1 at room temperature for 30 seconds without being dried. Whether water bubbles appeared on the surface of the substrate during the immersion was visually confirmed. The results are shown in Table 1.

In addition, whether, after a lapse of 30 seconds after the immersion of the test piece in the chemical solution, water droplets or water bubbles remained on the test piece immediately after being pulled up from each chemical solution (before drying) was visually confirmed. The results are shown in Table 1.

TABLE 1

| | Composition of Chemical Solution (100% by mass in all examples) | Specific Gravity | Presence or Absence of Water Bubbles During Immersion in Chemical Solution | Presence or Absence of Water Droplets or Water Bubbles Immediately After Pulling Up from Chemical Solution |
|---|---|---|---|---|
| Comparative Reference Example 1 | Isopropyl Alcohol | 0.786 | Absent | Absent |
| Reference Example 1 | Propylene Carbonate | 1.2047 | Present | Absent |
| Reference Example 2 | Dimethyl Carbonate | 1.0636 | Present | Absent |
| Comparative Reference Example 2 | Acetylacetone | 0.975 | Present | Present |
| Comparative Reference Example 3 | PGMEA | 0.97 | Present | Present |
| Comparative Reference Example 4 | Decane | 0.73 | Present | Present |

As shown in Table 1, in a case where the test pieces were immersed in the chemical solutions of Reference Examples 1 and 2 composed of an organic solvent (S1), water bubbles were observed on the substrate surface in any case, unlike a case where the test piece was immersed in the chemical solution of Comparative Reference Example 1 composed of an organic solvent other than the organic solvent (S1). Therefore, the chemical solutions of Reference Examples 1 and 2 composed of the organic solvent (S1) can be confirmed to have a low dissolving property with respect to water and also thought to be low in moisture absorbency.

In addition, unlike the test pieces immediately after being pulled up from the chemical solutions of Comparative Reference Examples 2 and 4, the test pieces immediately after being pulled up from the chemical solutions of Reference Examples 1 and 2 had no water droplets or water bubbles remaining on the test piece surface. Therefore, it was found that the chemical solutions of Reference Examples 1 and 2 composed of the organic solvent (S1) are greatly effective in replacing the water on the test piece surface with the chemical solution, and have good water removability on the test piece surface.

From the above description, it is presumed that in a case where a chemical solution containing the organic solvent (S1) is used in a method for processing a substrate, a state change step of allowing the chemical solution to reach a supercritical state in a state in which no moisture remains can be performed since the chemical solution is low in moisture absorbency but has high moisture removability on the substrate. Therefore, in the method for processing a substrate according to the present embodiment, the substrate surface can be dried without moisture remaining thereon, and thus the method for processing a substrate is presumed to have a good pattern collapse suppression effect.

Although the preferable examples of the present invention have been described above, the present invention is not limited to these examples. Additions, omissions, substitutions, and other modifications can be made without departing from the gist of the present invention. The present invention is not limited by the above description, but only by the scope of the appended claims.

What is claimed is:

1. A method for processing a substrate, for processing a surface of a substrate having projections/depressions formed on the surface, the method comprising:
a rinsing step of rinsing the surface of the substrate with a rinsing solution containing water;
a chemical solution replacement step of bringing a chemical solution into contact with the surface of the substrate that has been rinsed, to replace a liquid adhering to the surface of the substrate from the rinsing solution to the chemical solution;
a state change step of raising a temperature of the substrate wetted with the chemical solution to a temperature equal to or higher than a critical temperature of the chemical solution to allow the chemical solution to reach a supercritical state; and
a removing step of removing the chemical solution in the supercritical state from the surface of the substrate,
wherein the chemical solution contains an organic solvent (S1) having a higher specific gravity than water, provided that the organic solvent (S1) excludes organic solvents having a fluorine atom, and
the organic solvent (S1) includes at least one solvent selected from the group consisting of carbonate solvents and lactone solvents.

2. The method for processing a substrate according to claim 1,
wherein the organic solvent (S1) has a specific gravity of 1.1 or higher.

3. The method for processing a substrate according to claim 1,
wherein the chemical solution has a specific gravity of 1.1 or higher.

4. The method for processing a substrate according to claim 1,
wherein the chemical solution has a property that 0.5 to 40 g of water dissolves in 100 mL of the chemical solution at 25° C.

5. The method for processing a substrate according to claim 1,
wherein the chemical solution replacement step and the state change step are performed in different chambers, and a transport step of transporting the substrate from a first chamber where the chemical solution replacement step is performed to a second chamber where the state change step is performed is provided between the chemical solution replacement step and the state change step.

6. The method for processing a substrate according to claim 1, wherein the removing step includes an operation of removing the chemical solution from the surface of the substrate by tilting the substrate and flowing the chemical solution in the supercritical state.

7. A method for providing a chemical solution, for providing the chemical solution to a process line carrying out the method for processing a substrate according to claim 1.

8. The method for processing a substrate according to claim 1, wherein the chemical solution consists of the organic solvent (S1), and the organic solvent (S1) consists of at least one solvent selected from the group consisting of the carbonate solvents and the lactone solvents.

9. The method for processing a substrate according to claim 1, wherein the chemical solution consists of the organic solvent (S1), and the organic solvent (S1) consists of at least one solvent selected from the group consisting of propylene carbonate, dimethyl carbonate, ethylene carbonate, diethyl carbonate, butylene carbonate, furfuryl alcohol, tetrahydrofurfuryl alcohol, dihydrolevoglucosenone, γ-butyrolactone, γ-valerolactone and δ-valerolactone.

\* \* \* \* \*